Figure 1:
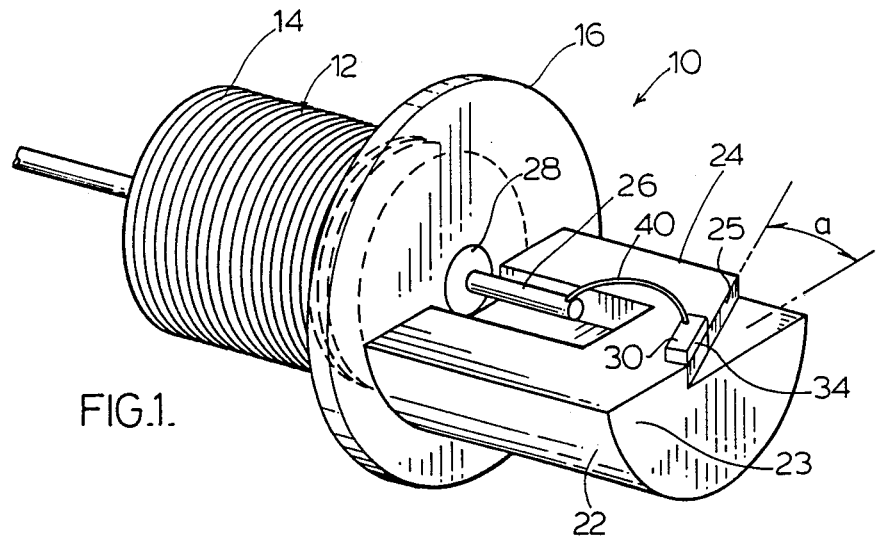

United States Patent [19]

Crocker et al.

[11] Patent Number: 4,769,684
[45] Date of Patent: Sep. 6, 1988

[54] ANGLE MOUNT HEADER

[75] Inventors: Stuart N. Crocker, Pointe Claire; Jeffrey S. Britton, Montreal, both of Canada

[73] Assignee: RCA Inc., Mississauga, Canada

[21] Appl. No.: 70,793

[22] Filed: Jul. 7, 1987

[51] Int. Cl.⁴ .......................................... H01L 33/00
[52] U.S. Cl. ........................................ 357/17; 357/19; 357/55
[58] Field of Search ............................. 357/17, 19, 55

[56] References Cited

U.S. PATENT DOCUMENTS

| | | | |
|---|---|---|---|
| 4,240,090 | 12/1980 | Hughes et al. | 357/30 |
| 4,581,629 | 3/1986 | Harvey et al. | 357/81 |
| 4,623,220 | 11/1986 | Grabbe | 357/17 X |
| 4,627,687 | 12/1986 | Dorn | 357/17 X |
| 4,638,343 | 1/1987 | Althous | 357/17 |

FOREIGN PATENT DOCUMENTS 60-76710  5/1985  Japan ........................................ 357/17

Primary Examiner—Martin H. Edlow
Attorney, Agent, or Firm—Raymond A. Eckersley

[57] ABSTRACT

There is disclosed a light emitting device which includes a header and an angle stripe light emitting diode. The header has a longitudinal axis and a forward mounting surface. The forward mounting surface includes a leading edge portion which extends perpendicular to the longitudinal axis. The mounting surface further includes a trailing alignment edge portion which extends rearwardly from the leading edge portion at a predetermined compensating angle. The light emitting diode is affixed in electrical and heat transfer relation to the mounting surface of the header such that the emitting facet is aligned with the trailing alignment edge portion of the header. The trailing alignment edge portion compensates for the offset angle that light is emitted from a stripe light emitting diode.

9 Claims, 1 Drawing Sheet

ANGLE MOUNT HEADER

The present invention relates to a light emitting device including a light emitting element. More particualrly, the present invention is directed to the mounting of the light emitting stripe diode within the light emitting device.

In the past, light emitting devices usually comprise a header having a surface mounting portion with a light emitting diode (LED) affixed to the mounting surface. The mounting surface typically includes a leading edge portion extending perpendicular to the longitudinal axis of the header. The LED is mounted with its light emitting facet aligned with the leading edge surface so that the light emitting facet of the LED is also perpendicular to the longitudinal axis.

The problem with the LED is that it is critical that the light reflected back into the active region of the LED is minimized since this reflected light can result in the LED lasing. Typically, LED's have anti-reflection facet coatings to reduce the amount of light reflected back into the active region of the structure. The problem with anti-reflection coatings is that rarely is the reflectivity actually zero, and thus a small amount of light is reflected back into the active region of the LED and at low temperatures the LED may lase. To overcome this reflection problem, an angle stripe LED has been developed. Angle stripe LEDs have anti-reflection coatings, but also provide for the stripe contact or opening from which light is emitted from the LED to be offset at an angle such that any light which is reflected, is reflected back at an angle away from or out of the active region. This further suppresses the tendancy of the LED to lase. However, by angling the stripe contact or offsetting the opening from which light is emitted, when combined with the index of a refraction of the medium, results in the maximum optical flux being emitted from the facet of the angle stripe LED at an angle anywhere from 5° to 20° from normal. Thus the development of the angle stripe LED has introduced mounting problems peculiar to this type of LED. It is imperative that the light be emitted from the light emitting diode in a direction which axially aligns with the fiber optic cable positioned adjacent the light emitting facet of the diode such that the maximum amount of light can be coupled into the optical fiber.

It is therefore an object of the present invention to provide a light emitting device wherein the light emitting element can be aligned on the header in such a fashion that the maximum amount of light is transmitted to an optical fiber cable.

It is a further object of the present invention to provide a light emitting device wherein an angle stripe LED may be readily mounted on the header with its directions of maximum optical flux in alignment with the longitudinal axis of the light emitting device.

According to one aspect of the present invention there is provided a light emitting device comprising a header including a longitudinal axis and a forward mounting surface. The mounting surface has a leading edge portion extending perpendicular to the longitudinal axis and a trailing alignment edge portion extending rearwardly from the leading edge portion at a predetermined compensating angle. The device further includes a light emitting element including a light emitting facet. The light emitting element is secured in electrical and heat transfer relation to the mounting surface with the emitting facet aligned with the trailing alignment edge portion of the header As a result, light is emitted from the facet substantially along the longitudinal axis of the header. By providing a trailing alignment edge portion that extends rearwardly from the perpendicular leading edge portion of the header, relatively easier and more reliable positioning of the light emitting device with its light emitting facet in proper positioned alignment on the header mounting surface can be manually obtained and visually verified. Further advantage is found in the present invention in that the entire lower surface of the light emitting element is positioned on the mounting surface of the header in heat transfer contact therewith. No portion of the light emitting device overhangs the leading edge portion of the header which could result in light emitting device breakage. Further, since the light emitting device is not seated a significant distance back from the leading edge, fiber alignment with the light emitting device is possible. Since the perpendicular leading edge portion is still present, standard fiber alignment and mounting equipment can be used.

Additionaly, this predetermined angle may range from between 5% and 20% and is preferably either 5% or 15%.

Figure 2:
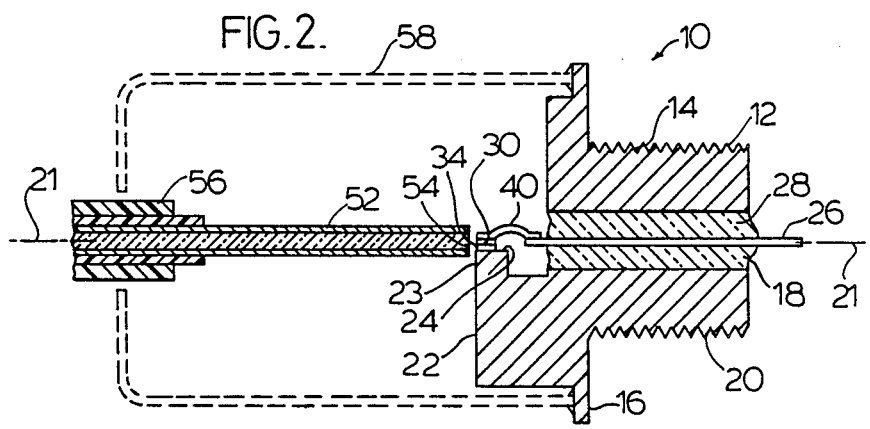
Figure 3:
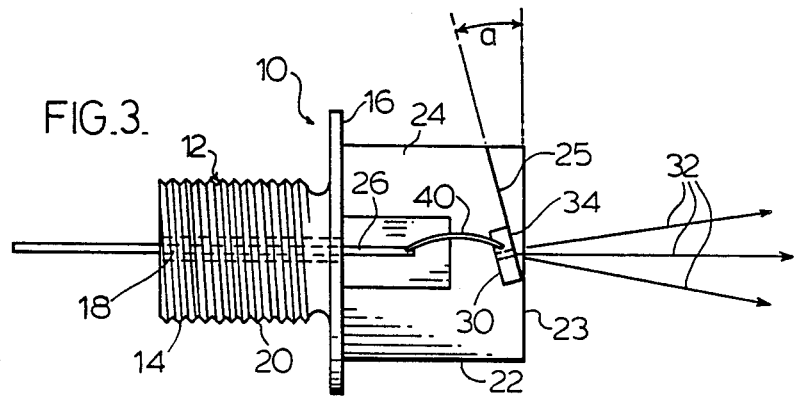

For better understanding of the nature of the present invention, reference may be had to the accompanying diagrammatic drawings in which FIG. 1 is a perspective view of the light-emitting device of the present invention;

FIG. 2 is a side sectional view of the light emitting device of the present invention; and, FIG. 3 is a plan view of the light emitting device of the prersent invention.

Referring to drawings, there is shown a light emitting device generally at 10. The device 10 includes a metal header 12 having a cylindrical stem 14 and an annular flange 16 extending radially from one end of the stem. The stem 14 has a passage 18 extending along its longitudinal axis, and a threaded outer surface 20. A mounting pedestal 22 projects from flange 16 away from stem 14. A mounting pedestal 22 has a flat mounting surface 24 which is substantially parallel to the longitudinal axis of stem 14. The mounting surface 24 includes a leading edge portion 23 which extends perpendicular to the longitudinal axis 21 of the header 10. A trailing edge surface 25 extends rearwardly from the leading edge surface 23 at a predetermined compensating angle 37 a". The trailing edge portion 25 can be accurately milled out from the pedestal.

A lead wire 26 extends through the passage 18 along the longitudinal axis and is sealed in the passage 18 by a bushing 28 of an electrical insulating material such as glass or plastic. The lead wire 26 projects beyond both ends of passage 18 and has one end adjacent but spaced from the mounting surface 24.

A light emitting element 30 is mounted on the mounting surface 24. In the drawings, an angle stripe LED is shown for the element 30. Element 30 could alternatively be a super radiant LED or super luminescent LED. These latter diodes are similar to an angle stripe LED in that their stripe contact is offset at a predetermined angle. The LED is electrically connected to the lead wire 26 by a terminal wire 40. The LED 30 is mounted on the mounting surface 24 such that its edge emitting facet 34 is in alignment with the trailing edge portion 25. The angle 37 a" is predetermined so as to compensate for the angle at which the angle stripe LED emits light whereby the light emitted from the light emitting device 10 is substantially along the longitudinal axis as shown by arrows 32 in FIG. 3. By having the trailing edge portion 25 extending rearwardly from the leading edge portion 23 in proximity to the longitudinal axis of the optical header, it is possible to closely align the emitting facet of the LED with the longitudinal axis of the header 10. This may be readily accomplished by manual assembly. By providing the trailing edge portion, it is not necessary for the operator to guess at which angle the light emitting diode element 30 must be aligned so as to allow for its light to be beamed along the longitudinal axis of the header. Further, the corner of the diode may be positioned at the point where the alignment edge portion and leading ledge portion intersect to faciliate assembly and alignment of the beam emitted from the LED with the longitudinal axis of the header. Proper positioning of the LED allows for maximum light coupling to a fiber optic cable.

An optical fiber 52 is shown positioned with its end facet 54 adjacent the light emitting facet 34 of the LED. The optical fiber 52 is positioned substantially in alignment with the longitudinal axis of the header 10. The fiber 52 is provided with a sheath 56 which is mounted within a housing 58 which in turn is secured to the flange 16. The device 10 is hermetically sealed.

In operation, diode 30 is forwarded biased by applying a voltage between the lead wire 26 and the stem 14. This causes light to be emitted from the light emitting facet 34. The light impinges on the end facet 54 of the optical fiber 52.

What we claim as new and desire to secure by Letters Patent of the United States are:

1. A light emitting device comprising:
   a header having a longitudinal axis and a forward mounting surface, said mounting surface having a leading edge portion extending perpendicular to the longitudinal axis and a trailing alignment edge portion extending rearwardly from the leading edge portion at a predetermined compensating angle; and,
   a light emitting element including a light emitting facet, said light emitting element being secured in electrical and heat transfer relation to said mounting surface with the emitting facet aligned with the trailing alignment edge portion whereby light is emitted from the facet substantially along the longitudinal axis of the header.

2. A light emitting device as claimed in claim 1 wherein said trailing alignment edge portion intersects with the leading edge portion.

3. A light emitting device as claimed in claim 1 wherein said predetermined angle is between about 5° and 20°.

4. A light emitting device as claimed in claim 1 wherein said predetermined angle is 5°.

5. A light emitting device as claimed in claim 1 wherein said predetermined angled is 15°.

6. A light emitting device as claimed in claim 1 wherein said light emitting element one of an angled stripe light emitting diode, super radiant light emitting diode, or a super luminescent light emitting diode.

7. A light emitting diode as claimed in claim 1 wherein the trailing edge portion is cut into the mounting surface and extends across a portion of the mounting surface.

8. A light emitting diode as claimed in claim 7 wherein the trailing edge portion extends rearwardly from the leading edge portion in proximity to the longitudinal axis.

9. A light emitting diode as claimed in claim 8 wherein a corner of the light emitting device is positioned where the trailing alignment edge portion meets the leading edge portion so as to position the facet in line with the longitudinal axis.

* * * * *